United States Patent
Furukawa (10) Patent No.: US 10,861,707 B2
(45) Date of Patent: Dec. 8, 2020

(54) METHOD FOR MANUFACTURING SEMICONDUCTOR DEVICE AND SEMICONDUCTOR MEMORY DEVICE

(71) Applicant: TOSHIBA MEMORY CORPORATION, Tokyo (JP)

(72) Inventor: Shinichi Furukawa, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 58 days.

(21) Appl. No.: 16/118,318

(22) Filed: Aug. 30, 2018

(65) Prior Publication Data

US 2019/0279878 A1    Sep. 12, 2019

(30) Foreign Application Priority Data

Mar. 8, 2018   (JP) .................................. 2018-042021

(51) Int. Cl.
| | |
|---|---|
| *H01L 27/11519* | (2017.01) |
| *H01L 21/311* | (2006.01) |
| *H01L 27/11556* | (2017.01) |
| *H01L 27/11524* | (2017.01) |
| *H01L 21/02* | (2006.01) |

(52) U.S. Cl.
CPC .. *H01L 21/31133* (2013.01); *H01L 27/11519* (2013.01); *H01L 27/11524* (2013.01); *H01L 27/11556* (2013.01); *H01L 21/02057* (2013.01)

(58) Field of Classification Search
CPC ......... H01L 27/11556; H01L 27/11575; H01L 27/11519; H01L 21/31133
See application file for complete search history.

(56) References Cited

U.S. PATENT DOCUMENTS

| | | |
|---|---|---|
| 8,399,357 B2 | 3/2013 | Ogawa et al. |
| 2011/0073866 A1 | 3/2011 | Kim et al. |
| 2013/0264626 A1* | 10/2013 | Sawa .................... H01L 29/788 |
| | | 257/316 |
| 2015/0270146 A1 | 9/2015 | Yoshihara et al. |

FOREIGN PATENT DOCUMENTS

| | | |
|---|---|---|
| JP | 2012209285 A | 10/2012 |
| JP | 5622512 B2 | 11/2014 |
| JP | 2015185806 A | 10/2015 |

* cited by examiner

*Primary Examiner* — Dale E Page
*Assistant Examiner* — Wilner Jean Baptiste
(74) *Attorney, Agent, or Firm* — Holtz, Holtz & Volek PC (57) ABSTRACT

A method for manufacturing a semiconductor device includes forming a sacrificial member on a foundation layer, the sacrificial member extending in a first direction along a front surface of the foundation layer; forming a line and space pattern including a plurality of structures on the foundation layer and the sacrificial member, the structures extending along the front surface of the foundation layer in a second direction crossing the first direction; and forming communication passages between the foundation layer and the structures by selectively removing the sacrificial member via spaces between the structures, the spaces being in communication with each other through the communication passages.

15 Claims, 10 Drawing Sheets

METHOD FOR MANUFACTURING SEMICONDUCTOR DEVICE AND SEMICONDUCTOR MEMORY DEVICE

CROSS-REFERENCE TO RELATED APPLICATIONS

This application is based upon and claims the benefit of priority from Japanese Patent Application No. 2018-042021, filed on Mar. 8, 2018; the entire contents of which are incorporated herein by reference.

FIELD

Embodiments relate to a method for manufacturing a semiconductor device, and a semiconductor memory device.

BACKGROUND

In a manufacturing process of a semiconductor device, processing solution is supplied to a wafer surface during a wet etching process and a surface cleaning process, and then, the wafer surface is processed to be dried. When the line and space pattern with a large aspect ratio is formed on the wafer surface, for example, there may be a case where the line and space pattern is collapsed due to Laplace pressure induced by the processing solution remaining therein.

BRIEF DESCRIPTION OF THE DRAWINGS

FIGS. 4A to 8B are schematic views showing a manufacturing processes of the semiconductor memory device according to the embodiment;

DETAILED DESCRIPTION

According to one embodiment, a method for manufacturing a semiconductor device includes forming a sacrificial member on a foundation layer, the sacrificial member extending in a first direction along a front surface of the foundation layer; forming a line and space pattern including a plurality of structures on the foundation layer and the sacrificial member, the structures extending along the front surface of the foundation layer in a second direction crossing the first direction; and forming communication passages between the foundation layer and the structures by selectively removing the sacrificial member via spaces between the structures, the spaces being in communication with each other through the communication passages.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
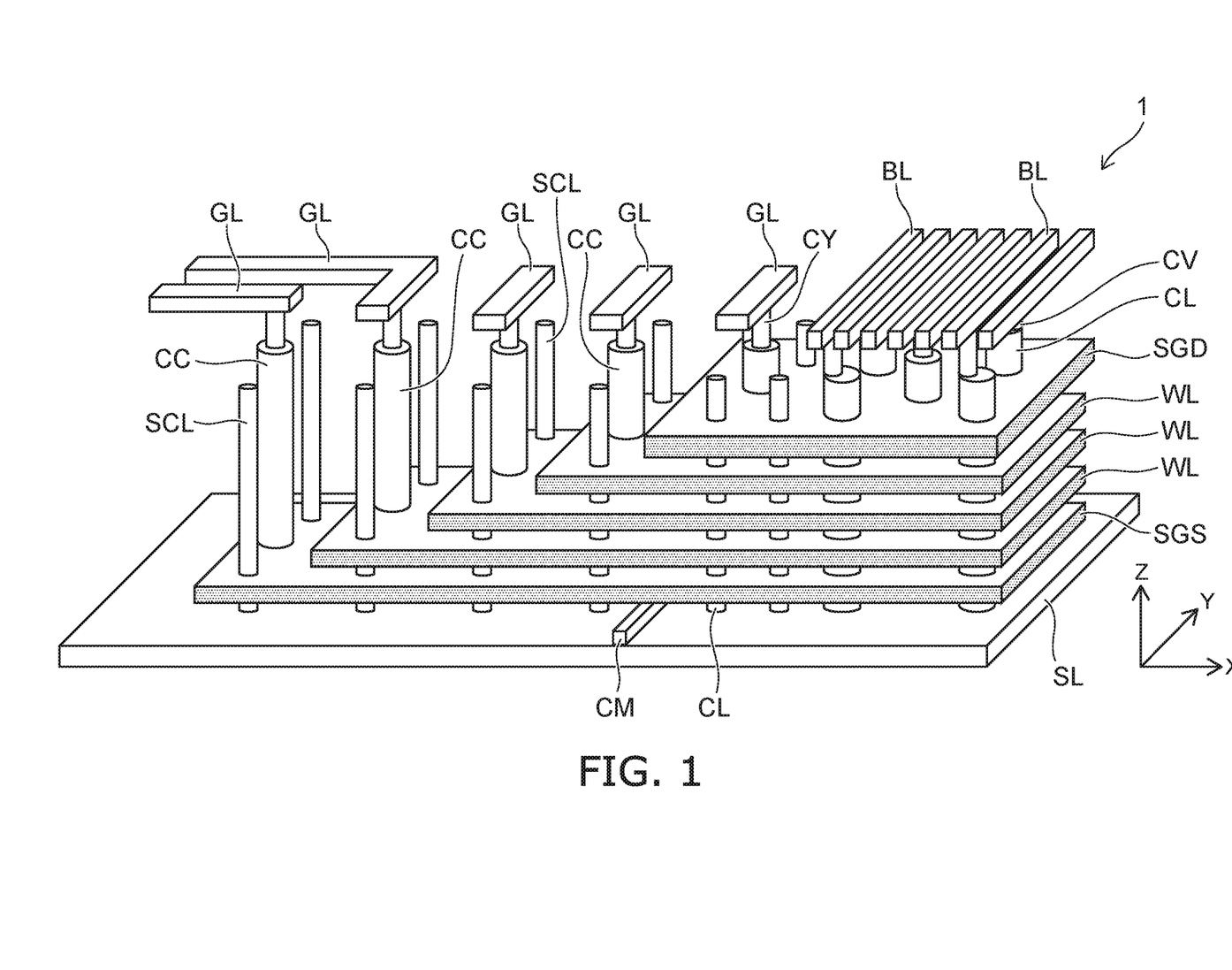
FIG. 1 is a perspective view schematically showing a semiconductor memory device according to an embodiment.

FIG. 1 is a perspective view schematically showing a semiconductor memory device 1 according to an embodiment. The semiconductor memory device 1 is, for example, a NAND type non-volatile memory device including memory cells three-dimensionally disposed. In FIG. 1, insulating films are omitted, which electrically insulate the components shown therein from each other.

The semiconductor memory device 1 includes multiple electrode layers (hereinafter, a selection gate SGS, word lines WL, and a selection gate SGD) stacked above a source layer SL, and multiple columnar bodies CL.

Figure 3A:
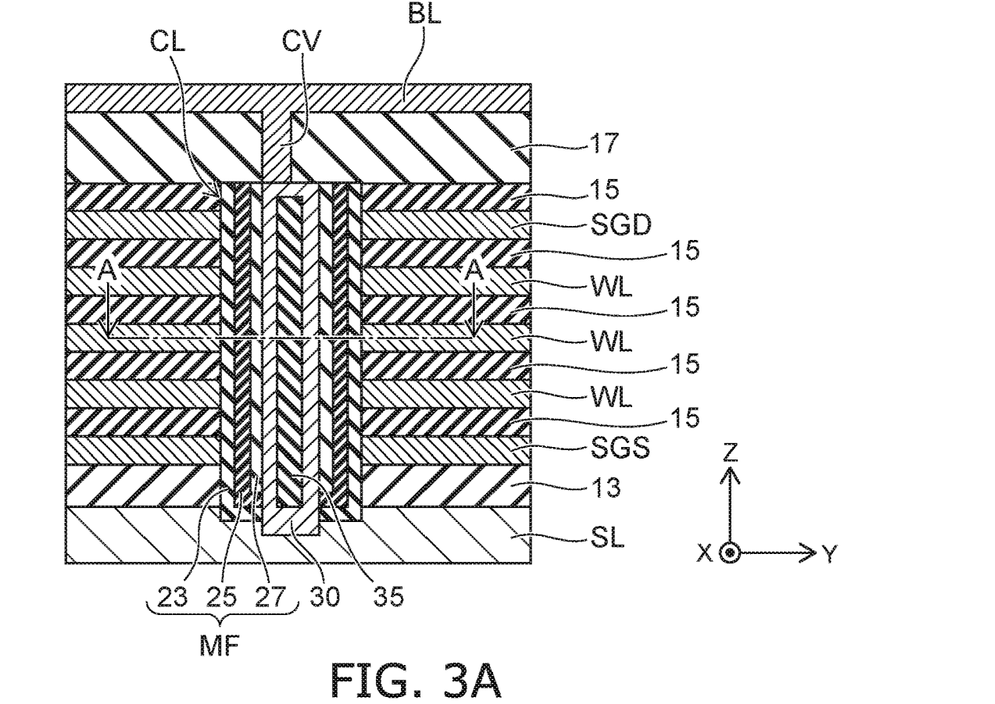
FIGS. 3A and 3B are schematic cross-sectional views showing the semiconductor memory device according to the embodiment.

The columnar bodies CL extends through the selection gate SGS, the word lines WL, and the selection gate SGD in the stacking direction (i.e., Z-direction). The columnar body CL includes a semiconductor layer 30 extending in the Z-direction (see FIG. 3), and is electrically connected to a bit line BL through a connection plug CV. That is, the columnar body CL is electrically connected to the source layer SL.

As shown in FIG. 1, each end portion of the selection gate SGS, the word lines WL, and the selection gate SGD is provided with a stair shape. The selection gate SGS, the word lines WL, and the selection gate SGD are connected to interconnections GL in the upper layer through contact plugs CC and connection plugs CY connected to end portions of the election gate SGS, the word lines WL, and the selection gate SGD, respectively.

The semiconductor memory device 1 further includes columnar support bodies SCL, and embedded members CM. The columnar support bodies SCL each extends in the Z-direction through at least one of the selection gate SGS, the word lines WL, and the selection gate SGD. The columnar support bodies SCL each include, for example, insulator such as silicon oxide. The embedded members CM are provided between the source layer SL and the selection gate SGS, and extend in the Y-direction along a surface of the source layer SL. The embedded members CM each include, for example, a material same as the materials of the selection gate SGS, the word lines WL, and the selection gate SGD.

Figure 2:
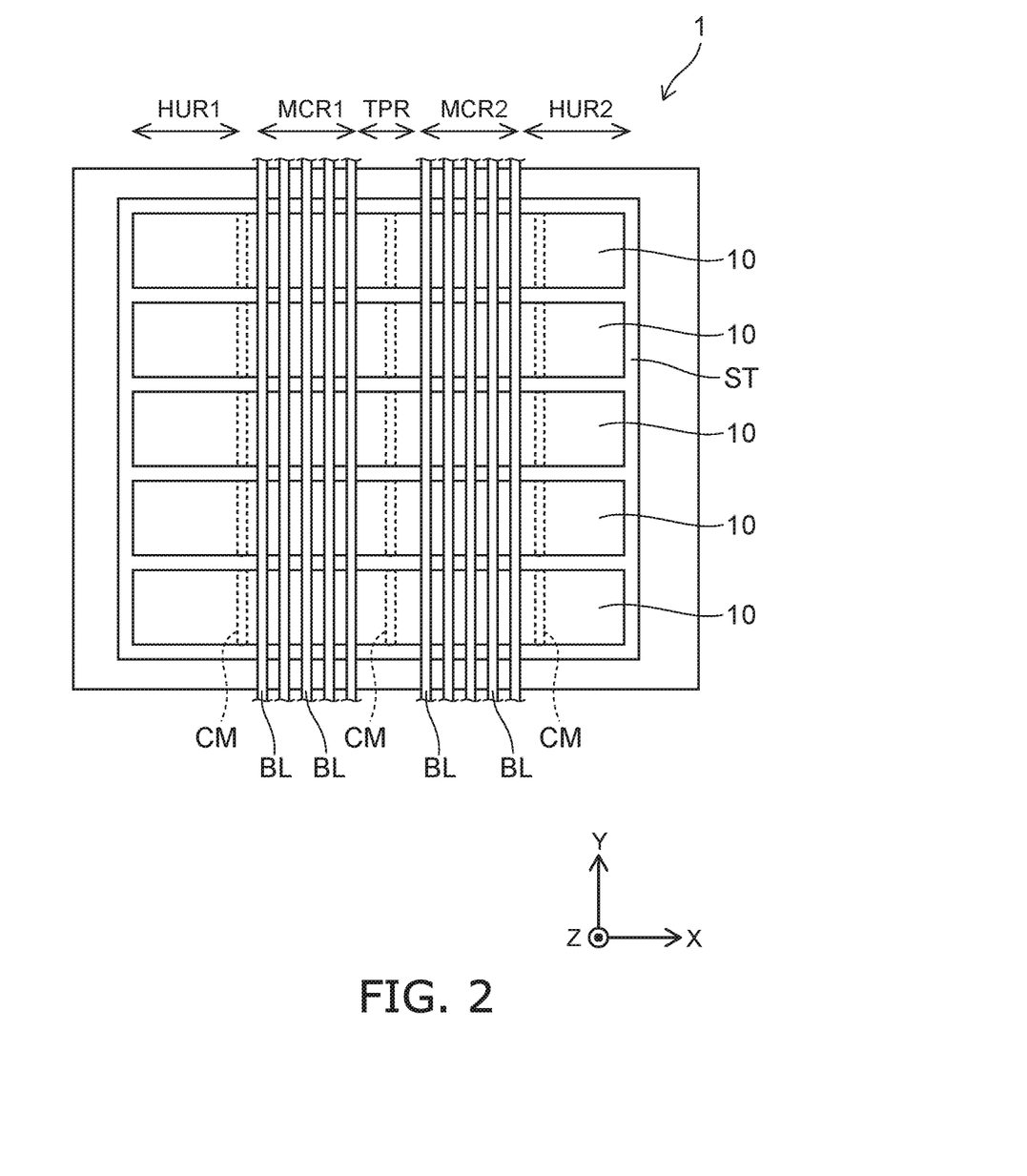
FIG. 2 is a schematic plan view showing a top surface of the semiconductor memory device according to the embodiment.

FIG. 2 is a schematic plan view showing a top surface of the semiconductor memory device 1 according to the embodiment. The semiconductor memory device 1 includes multiple stacked bodies 10, for example, arranged in the Y-direction. The stacked bodies 10 each include a selection gate SGS, word lines WL, and a selection gate SGD stacked in the Z-direction.

As shown in FIG. 2, an outer periphery of the stacked bodies 10 is defined by a slit ST. The slit ST has a depth from a level of top surfaces of the stacked bodies 10 to the source layer SL. The slit ST is filled with an insulating film such as a silicon oxide film, which electrically insulates the adjacent stacked bodies 10 (see FIG. 8B) from each other.

The stacked bodies 10 each extend, for example, in the X-direction, and include memory cell regions MCR1, MCR2, hook-up regions HUR1, HUR2, and a tap region TPR. The memory cell regions MCR1, MCR2, the hook-up regions HUR1, HUR2, and the tap region TPR are arranged in the X-direction.

The hook-up regions HUR1 and HUR2 are placed at both ends of each stacked body 10, respectively. The memory cell regions MCR1 and MCR2 are provided between the hook-up regions HUR1 and HUR2. The tap region TPR is placed between the memory regions MCR1 and MCR2.

The multiple columnar bodies CL are provided in the memory cell regions MCR1 and MCR2, and the bit lines BL are placed above the memory cell regions MCR1 and MCR2. The contact plugs CC are provided in the hook-up regions HUR1 and HUR2 and connected to the end portions of the selection gate SGS, the word lines WL and the selection gate SGD formed in the staircase. The columnar support bodies SCL are provided in the hook-up regions HUR1 and HUR2.

A contact plug is provided in the tap region TPR, for example, to electrically connect the source layer SL and an interconnection in the upper layer. Another contact plug is also provided in the tap region TPR to electrically connect other interconnection in the upper layer and a circuit provided between the source layer SL and a substrate (not shown). Furthermore, columnar support bodies SCL are also provided in the tap region TPR.

As shown in FIG. 2, the embedded members CM are placed in the hook-up regions HUR1, HUR2 and the tap region TPR, respectively. The embedded members CM are provided in a bottom portion of the stacked bodies 10, and the both ends thereof contact the insulating film provided in the slit ST.

When the embedded members CM include, for example, metal and placed in the memory cell region MCR1 or MCR2, the embedded members CM may interfere with the connection of the source layer SL and the semiconductor layers included in the columnar bodies CL, and cause short-circuit between the columnar bodies. In contrast, the contact plugs in the hook-up regions HUR1, HUR2 and the tap region TPR are not provided in high density comparing with the columnar bodies CL. Thereby, it is possible to ensure the space margin enough to place the embedded members CM between the contact plugs. Since the columnar support bodies SCL are insulator, short-circuit is not caused therebetween by the embedded members CM. Thus, the embedded members CM are placed in the hook-up regions HUR1, HUR2 and the tap region TPR, respectively.

Figure 3B:
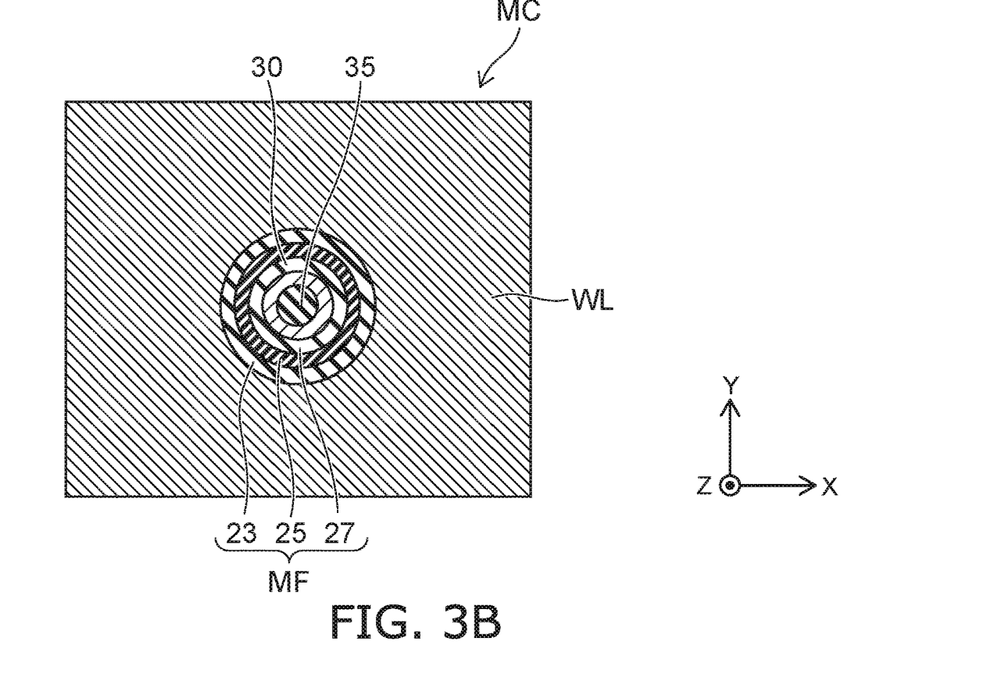

FIGS. 3A and 3B are schematic cross-sectional views showing the semiconductor memory device 1 according to the embodiment. FIG. 3A is a schematic view showing a cross-sectional structure of the columnar body CL. FIG. 3B is a schematic view showing a cross section along line A-A shown in FIG. 3A, and shows the structure of the memory cell MC.

As shown in FIG. 3A, a columnar body CL extends in the Z-direction through the stacked structure on the source layer SL of insulating films 13, 15, the selection gate SGS, the word lines WL and the selection gate SGD. The insulating films 15 are placed between the selection gate SGS and the word lines WL, between the adjacent word lines WL, and between the word lines WL and the selection gate SGD, respectively. An insulating film 17 is provided between the uppermost insulating film 15 and the bit line BL.

The columnar body CL includes a memory film MF, the semiconductor lines WL, and insulative core 35. The insulative core 35 is, for example, silicon oxide, and extends in the Z-direction. The semiconductor layer 30 is provided so as to surround the insulative core 35, and is connected to the source layer SL at the bottom end. The semiconductor layer 30 is connected to the connection plug CV at the top end. The semiconductor layer 30 is, for example, a polysilicon layer.

The memory film MF is provided to cover a side surface of the semiconductor layer 30, and extends in the Z-direction along the semiconductor layer 30. The memory film MF has multilayer structure including, for example, a blocking insulator film 23, a charge storage film 25 and a tunneling insulator film 27.

The blocking insulator film 23, the charge storage film 25 and the tunneling insulator film 27 are stacked in a direction from a word line WL toward the insulative core 35. The blocking insulator film 23 and the tunneling insulator film 27 are, for example, silicon oxide films. The charge storage film 25 is, for example, a silicon nitride film. The blocking insulator film 23 may have, for example, a multilayer structure including metal oxide such as an aluminum oxide.

The memory cell MC shown in FIG. 3B is provided in a portion where the columnar body CL crosses the word line WL. The memory film MF is positioned between the semiconductor layer 30 and the word line WL, and is provided so as to surround the semiconductor layer 30. A portion of the memory film MF positioned between the semiconductor layer 30 and the word line WL functions as the memory portion of the memory cell MC. The semiconductor layer 30 functions as a channel of the memory cell MC, and the word line WL functions as a control gate of the memory cell MC.

The memory film MF may include the charge storage films 25 separated one another in an extending direction of the columnar body CL (i.e., Z-direction). The charge storage films 25 each are positioned between the semiconductor layer 30 and the word line WL. In such a case, the memory cell MC may have a structure in which the charge storage films 25 are conductive, and each function as a floating gate.

Next, a manufacturing method of the semiconductor memory device 1 according to the embodiment will be described with reference to FIGS. 4A to 8B. FIGS. 4A to 8B are schematic views sequentially showing manufacturing processes of the semiconductor memory device 1.

Figure 4A:
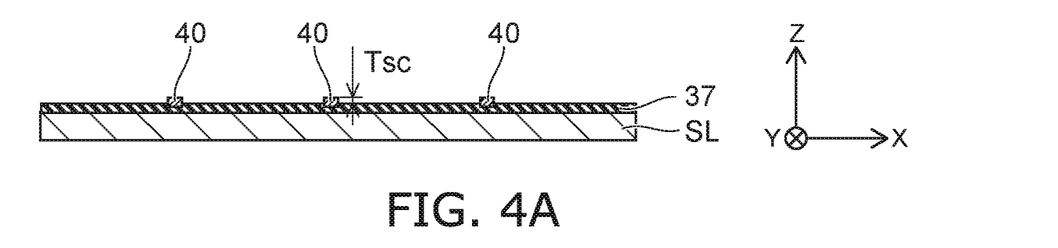
Figure 4B:
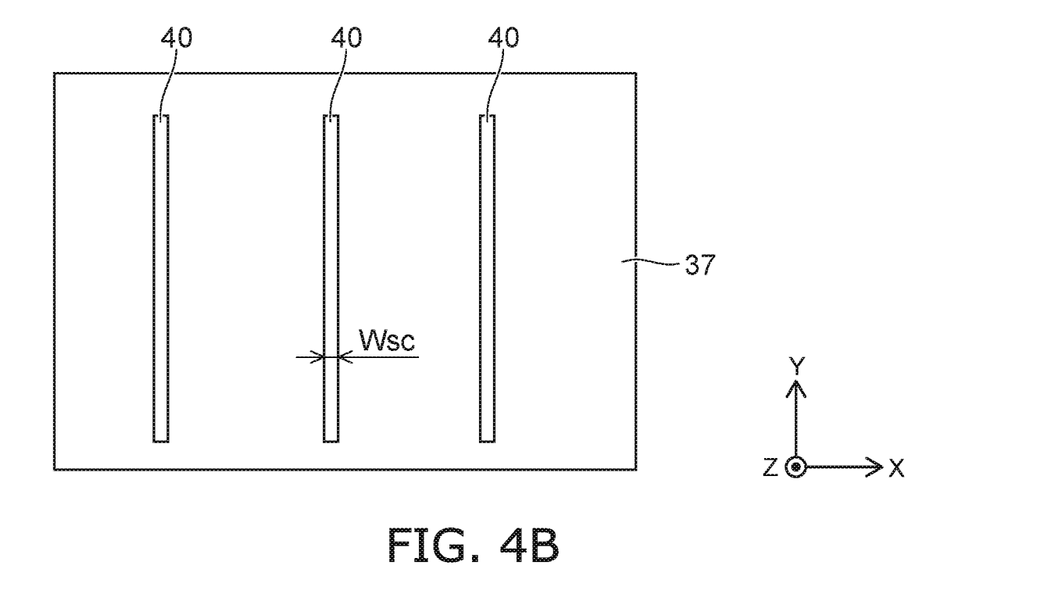

FIG. 4A is a schematic view showing a cross section of the source layer 37 and an insulating film 37 and sacrificial members 40 formed on the source layer SL. FIG. 4B is a plan view showing a top surface of the insulating film 37. The source layer SL is, for example, a conductive polysilicon layer, and is provided above a substrate (not shown) via an interlayer insulating film.

As shown in FIGS. 4A and 4B, the line-shaped sacrificial members 40 extending in the Y-direction are provided on the insulating film 37. The insulating film 37 is, for example, a silicon oxide film. The sacrificial members 40 are, for example, undoped polysilicon.

A thickness $T_{SC}$ in the Z-direction and a width $W_{SC}$ in the X-direction of the sacrificial members 40 are for example, not less than 14 nanometers (nm). The thickness $T_{SC}$ and the width $W_{SC}$ are preferably not less than 20 nm, and more preferably not less than 30 nm.

Figure 5A:
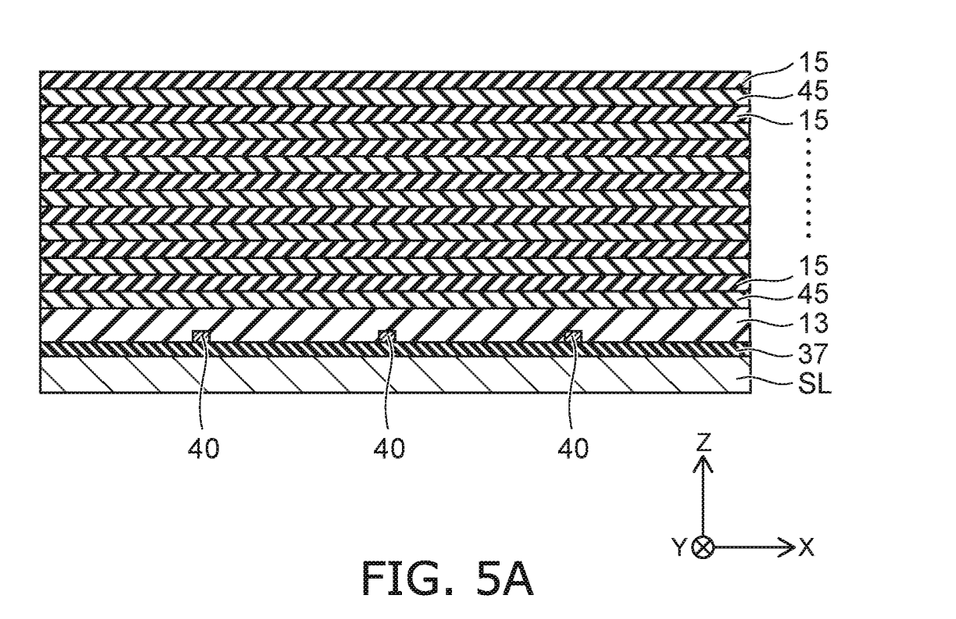

As shown in FIG. 5A, the insulating film 13 is formed on the insulating film 37. The insulating film 13 is formed so as to cover the sacrificial members 40. Furthermore, sacrificial films 45 and the insulating films 15 are stacked alternately on the insulating film 13. The number of the sacrificial films 45 stacked is, for example, the same as the number of the selection gate SGS, the word lines WL and the selection gate SGD. The insulating films 13 and 15 are, for example, silicon oxide films. The sacrificial films 45 are, for example, silicon nitride films.

Figure 5B:
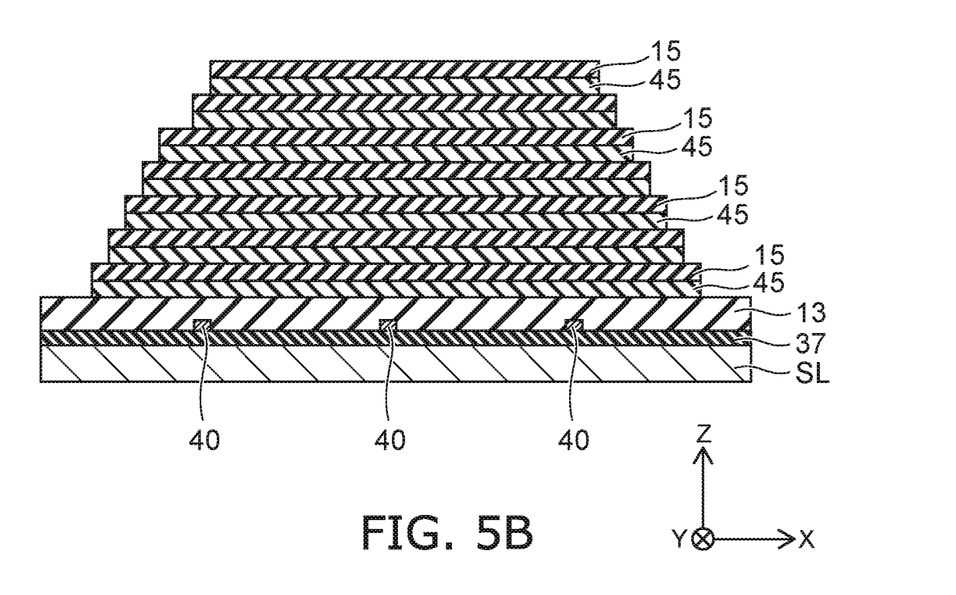

As shown in FIG. 5B, end portions of the insulating films 15 and the sacrificial films 45 are formed into the staircase. The insulating films 15 and the sacrificial films 45 are sequentially removed, for example, while the edge of the etching mask (not shown) is set back step by step.

Figure 6A:
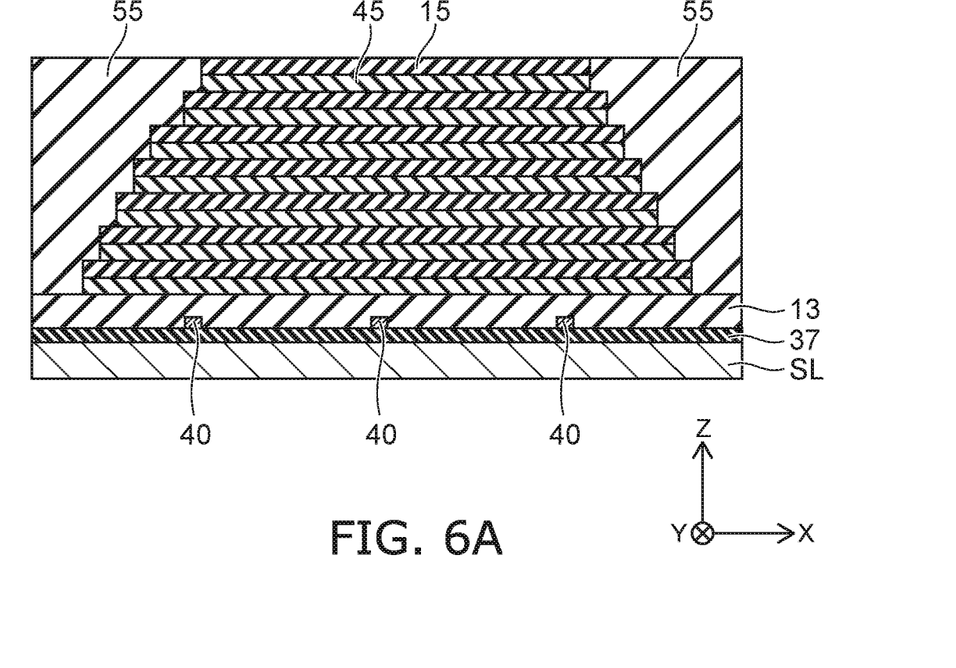

As shown in FIG. 6A, an insulating film 55 are formed to cover end portions of the insulating films 15 and the sacrificial films 45. The insulating film 55 is formed so that the top surface thereof is positioned at a level same as a top surface of the uppermost insulating film 15. The insulating film 55 is, for example, a silicon oxide film.

Figure 6B:
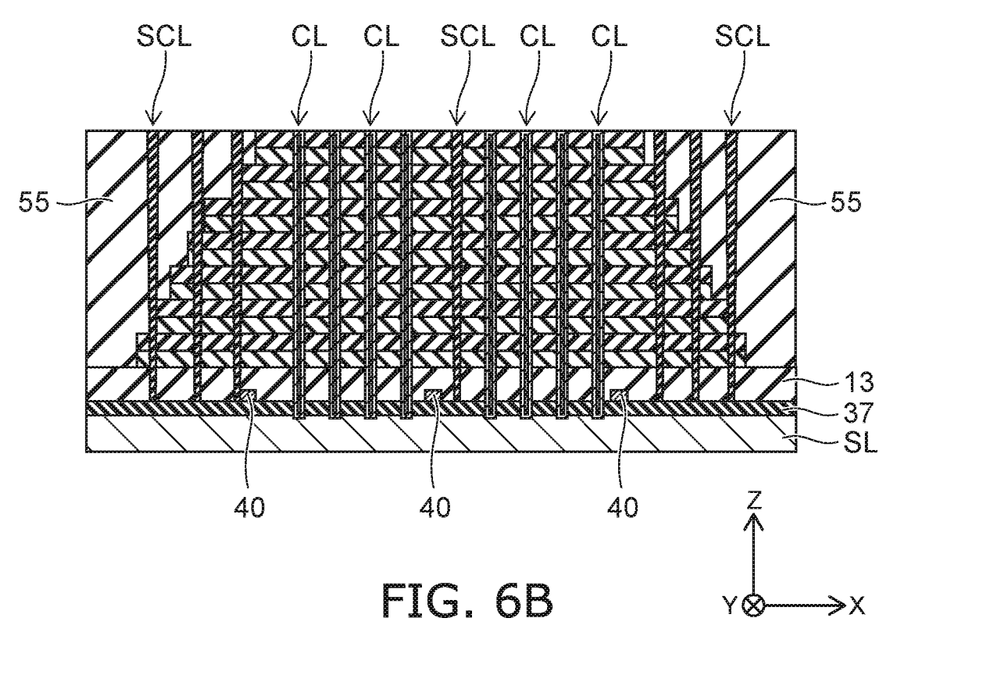

As shown in FIG. 6B, the columnar bodies CL and the columnar support bodies SCL are formed so as to extend through the sacrificial films 45. The columnar bodies CL are formed at positions separated from the sacrificial members 40, for example, with spacing at least broader than the displacement in the photo-alignment. Thereby, it is possible to avoid the interference between the columnar bodies CL and the sacrificial members 40. On the other hand, it is possible to place the columnar support body SCL in the vicinity of the sacrificial members 40.

Figure 7A:
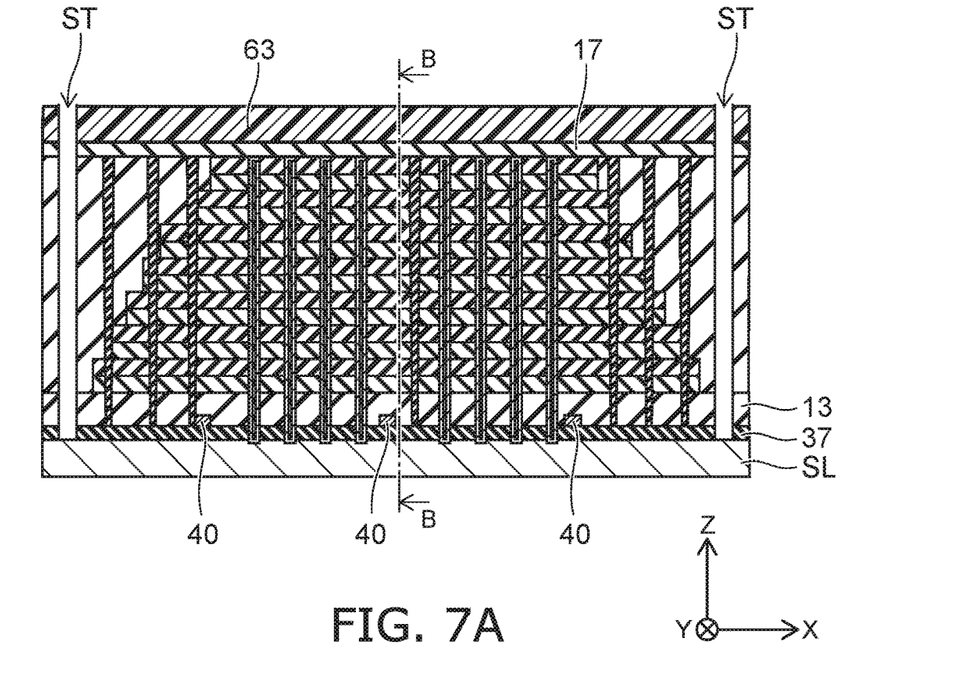

As shown in FIG. 7A, after an insulating film 17 covering the columnar bodies CL and the columnar supports SCL are formed, the slit ST is formed by using a mask layer 63. The slit ST is formed using, for example, anisotropic RIE (Reactive Ion Etching) so as to have a depth from a top surface of the insulating film 17 to the source layer SL.

Figure 7B:
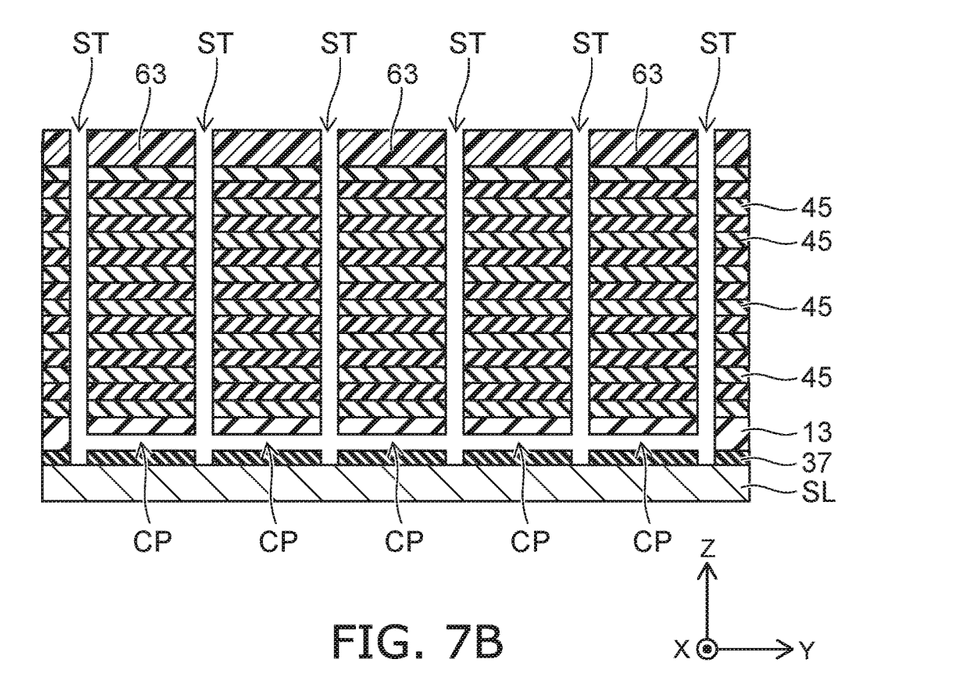

As shown in FIG. 7B, communication passages CP are formed between the lowermost sacrificial film 45 and the source layer SL. FIG. 7B and the following FIGS. 8A and 8B are schematic views showing cross section along the line B-B shown in FIG. 7A.

The communication passages CP are formed by selectively removing the sacrificial members 40 through the slit ST. The communication passages CP are cavities formed by selectively removing the sacrificial members 40.

For example, etching solution is supplied through the slit ST so that poly-silicon is selectively etched without etching the silicon oxide film and the silicon nitride film. Moreover, the etching solution is used in the etching of the sacrificial members 40 so that an etching rate of the undoped poly-silicon is larger than an etching rate of the conductive poly-silicon including impurities doped therein.

Figure 8A:
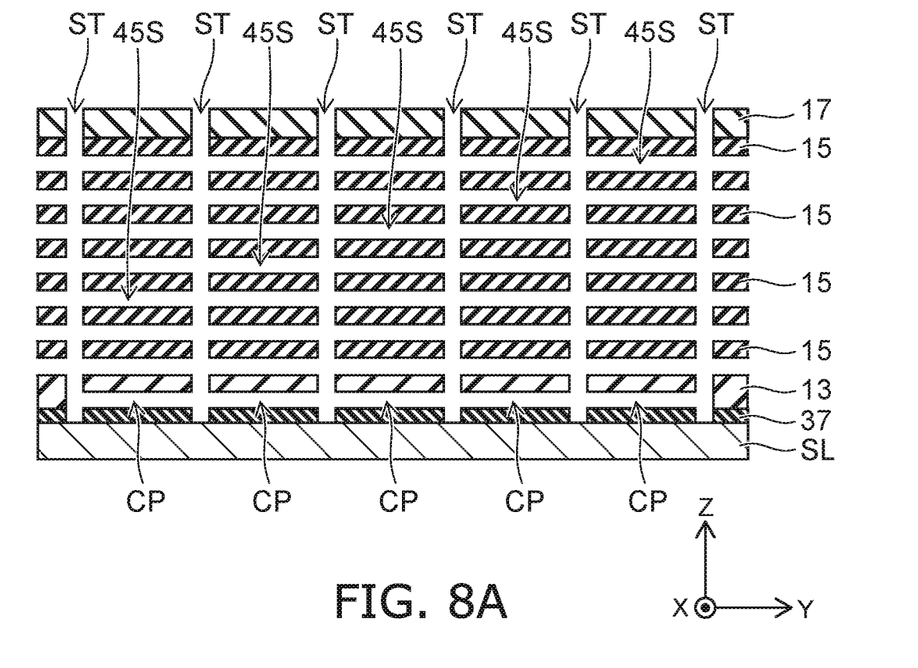
Figure 8B:
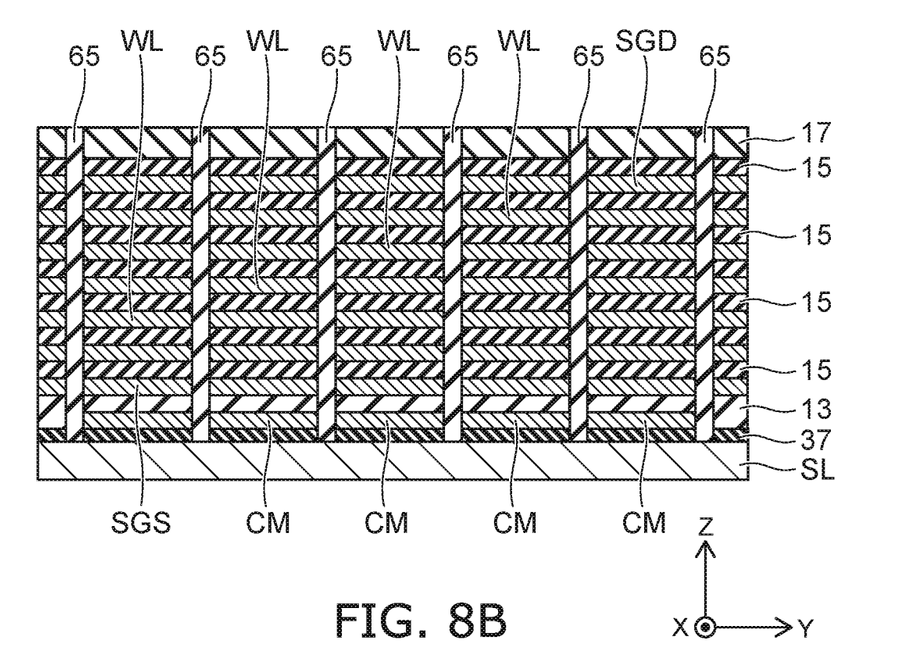

As shown in FIG. 8A, after the mask layer 63 is removed, the sacrificial films 45 are selectively removed through the slit ST, and spaces 45S are formed between the insulating films 15. For example, the sacrificial films 45 that are the silicon nitride films are selectively removed by supplying hot phosphoric acid via the slit ST.

As shown in FIG. 8B, after a metal layer is formed inside the spaces 45S through the slit ST, an insulating film 65 is formed so as to fill the slit ST. The selection gate SGS, the word lines WL and the selection gate SGD are formed inside the spaces 45S. At this time, the metal layer is also deposited in the communication passage CP, and the embedded members CM are formed. The embedded members CM are formed such that the end surfaces thereof contact the insulating film 65.

Then, the contact plugs CC and the upper layer including the interconnections GL, the bit lines BL and the like are formed to complete the semiconductor memory device 1 (see FIG. 1).

Figure 9A:
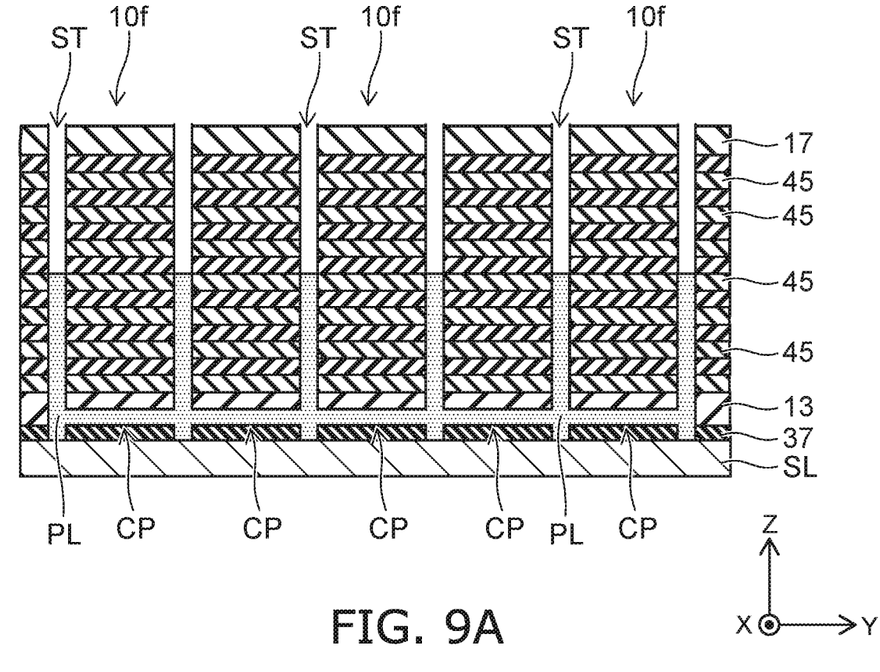
FIGS. 9A and 9B are schematic views showing a manufacturing method of the semiconductor memory device according to the embodiment.
Figure 9B:
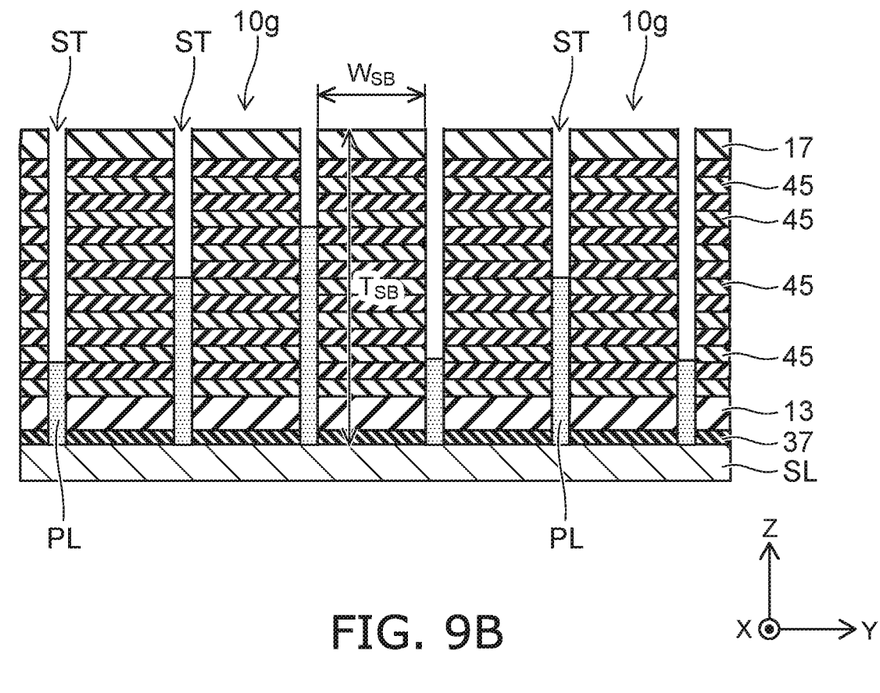

FIGS. 9A and 9B are schematic views showing a manufacturing method of the semiconductor device according to the embodiment. FIG. 9A is a schematic view showing a step of removing the mask layer 63 in the manufacturing process shown in FIG. 7B. FIG. 9B is a schematic view showing the same step of a manufacturing method in which the communication passages CP are not provided.

The mask layer 63 is, for example, a resist film, and is removed by using stripping solution or acid solution. Through the removing process, a part of the stripping solution or the acid solution, or a part of a cleaning solution replacing the stripping solution or acid solution may remain inside the slit ST. In the example shown in FIG. 9A, portions of the slit ST are connected by the communication passage CP. Thereby, the processing solution PL remains inside the portions of the slit ST with substantially the same amount between the stacked bodies 10f. On the contrary, since the communication passage CP is not formed in the example shown in FIG. 9B, various amounts of the processing solution PL remain in the portions of the slit ST between the stacked bodies 10g. Thus, Laplace pressure is induced by the difference of interfacial tension due to the processing solution PL remaining in the portions of the slit ST, and the stacked bodies 10g including the insulating films 15 and the sacrificial films 45 are deflected, for example. When the aspect ratio ($T_{SB}/W_{SB}$) of the stacked bodies 10g is large, the deflection amount becomes large, and the stacked bodies may be collapsed.

In the manufacturing method of the semiconductor device according to the embodiment, the processing solution PL remains uniformly in the slit ST by the communication passages CP, and thus, it is possible to suppress the Laplace pressure. Thereby, the structure having a high aspect ratio can be avoided to be collapsed in a wet process in the manufacturing process of the semiconductor device. Accordingly, it is possible to improve the manufacturing yield of the semiconductor device.

The communication passage CP has a size in cross section thereof, for example, not less than 30 nm in the width and height so that the processing solution flows smoothly, and remains uniformly in the portions of the slit ST. The shape of the cross section of the communication passage CP is not limited to a rectangular, and may be circular. In such a case, a radius of the cross sectional shape may be enough to be not less than 15 nm, for example. Higher density of the communication passages CP in the foundation layer makes the strength lower in the structure formed thereon. Preferably, the communication passages CP are appropriately disposed at the center and both ends of a stacked body as illustrated in FIG. 2.

In the semiconductor memory device 1 shown in FIG. 1, the number of the word lines stacked is preferably increased to enlarge the memory capacity. That is, the number of the sacrificial films 45 stacked becomes large. The aspect ratio of the stacked body becomes large, and thus, the stacked body may be collapsed easily. Accordingly, the manufacturing method according to the embodiment may improve the manufacturing yield of the semiconductor memory device 1.

Figure 10A:
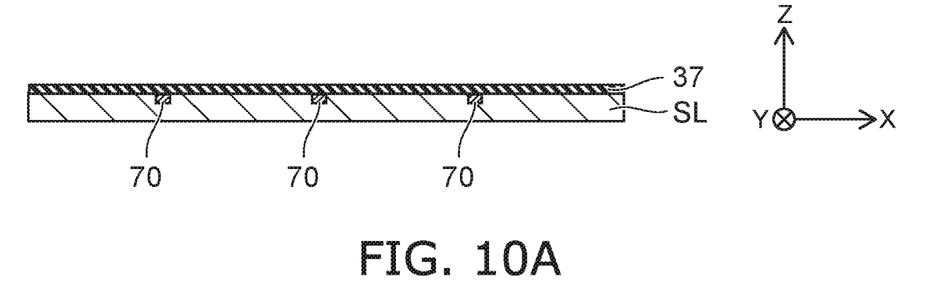
FIGS. 10A and 10B are schematic views showing a manufacturing method of the semiconductor memory device according to a variation of the embodiment.
Figure 10B:
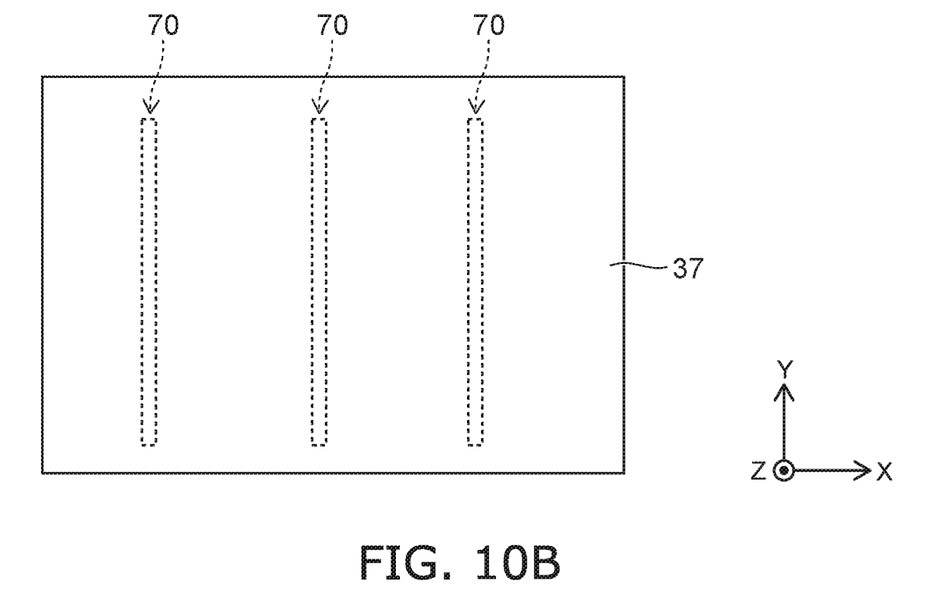

FIGS. 10A and 10B are schematic views showing a manufacturing method of the semiconductor memory device 1 according to a variation of the embodiment. FIG. 10A is a schematic view showing the cross section of sacrificial members 70 formed on the source layer SL and an insulating film 37 formed on the sacrificial members 70. FIG. 10B is a plan view showing a top surface of the insulating film 37.

As shown in FIG. 10A, the sacrificial members 70 are formed in grooves that are formed in the source layer SL. As shown in FIG. 10B, the sacrificial members 70 are formed into a line shape extending in the Y-direction. The sacrificial members 70 include, for example, a metal or undoped polysilicon.

Also in the example, the semiconductor memory device 1 is formed through the manufacturing processes shown in FIG. 5A to FIG. 8B. By selectively removing the sacrificial members 70, the communication passages CP are formed as the grooves in the source layer SL. Thereby, the processing solution uniformly remains in the slit ST through the wet process, and it is possible to suppress Laplace pressure.

In the example, the sacrificial members 70 are provided in the grooves of the source layer SL. Thus, the top surface of the source layer SL is maintained to be flat, and it is possible to reduce the influence of the sacrificial members 70 on the respective layers stacked thereabove. Thereby, the sacrificial members 70 may have a size larger in the cross section, i.e., may be formed with the larger cross section.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a conductive layer;
a plurality of electrode layers stacked above the conductive layer, the electrode layers extending in a first direction along a front surface of the conductive layer;
a columnar body extending through the electrode layers in a stacking direction of the electrode layers, the columnar body including a semiconductor layer extending in the stacking direction;
a first insulating film covering first side surfaces of the electrode layers;
a second insulating film covering second side surfaces of the electrode layers other than the first side surfaces, the electrode layers and the columnar body being provided between the first and second insulating films; and
an embedded member provided between the conductive layer and a lowermost electrode layer of the electrode layers, the embedded member extending in a second direction along the front surface of the conductive layer and crossing the first direction, and the embedded member having a first end contacting the first insulating film and a second end contacting the second insulating film.

2. The device according to claim 1, wherein the embedded member includes a material that is the same as a material of the electrode layers.

3. The device according to claim 1, further comprising:
a columnar support body extending through at least one electrode layer of the electrode layers,
wherein:
the at least one electrode layer includes a first region and a second region,
the columnar body extends through the first region,
the columnar support body extends through the second region, and
the embedded member is positioned between the second region and the conductive layer.

4. The device according to claim 1, wherein:
the electrode layers are provided in a stacked body having first and second side surfaces,
the second side surface is positioned on a side opposite to the first side surface,
the first insulating film is provided on the first side surface, and
the second insulating film is provided on the second side surface.

5. The device according to claim 1, wherein the embedded member is positioned inside a groove provided in the conductive layer.

6. The device according to claim 1, comprising:
a plurality of stacked bodies provided on the conductive layer, the plurality of stacked bodies being arranged in the second direction, and each of the stacked bodies including the electrode layers and the embedded member,
wherein the embedded members of the stacked bodies are arranged in the second direction.

7. The device according to claim 1, further comprising:
an interconnection provided above the electrode layers, and extending in the second direction,
wherein:
the semiconductor layer is electrically connected to the interconnection, and
no interconnection electrically connected to the semiconductor layer is placed above the embedded member.

8. The device according to claim 1, wherein the columnar body includes a charge storage film positioned between the semiconductor layer and the electrode layers.

9. The device according to claim 1, wherein:
the columnar body includes a plurality of charge storage portions positioned between the semiconductor layer and the electrode layers, and
the charge storage portions are separated from each other in the stacking direction, and are placed between the semiconductor layer and the electrode layers, respectively.

10. The device according to claim 9, wherein the charge storage portions are conductive.

11. The device according to claim 1, wherein the columnar body includes an insulator extending in the stacking direction, the insulator being positioned inside the semiconductor layer.

12. The device according to claim 1, wherein:
the columnar body contacts the conductive layer, and
the semiconductor layer is connected to the conductive layer.

13. The device according to claim 1, wherein the columnar body is provided apart from the first and second insulating films.

14. The device according to claim 1, wherein the embedded member is provided between the first and second insulating films.

15. The device according to claim 1, wherein each of the first and second insulating films comprises a planar body extending in the first direction along the electrode layers.

* * * * *